(12) United States Patent
Kim et al.

(10) Patent No.: US 7,033,909 B2
(45) Date of Patent: Apr. 25, 2006

(54) METHOD OF FORMING TRENCH ISOLATIONS

(75) Inventors: Hong-Rae Kim, Seoul (KR); Ju-Bum Lee, Gyeonggi-do (KR); Min Kim, Suwon (KR)

(73) Assignee: Samsung Electronics Co., Ltd., (KR)

( * ) Notice: Subject to any disclaimer, the term of this patent is extended or adjusted under 35 U.S.C. 154(b) by 68 days.

(21) Appl. No.: 10/822,378

(22) Filed: Apr. 12, 2004

(65) Prior Publication Data
US 2005/0009293 A1 Jan. 13, 2005

(30) Foreign Application Priority Data
Jul. 10, 2003 (KR) .................. 10-2003-0046982

(51) Int. Cl.
*H01L 21/76* (2006.01)
(52) U.S. Cl. .................. 438/435; 438/427; 438/424
(58) Field of Classification Search ............. 438/424, 438/427, 435
See application file for complete search history.

(56) References Cited

U.S. PATENT DOCUMENTS

| 6,756,654 B1 * | 6/2004 | Heo et al. ............ 257/510 |
| 2002/0076900 A1 * | 6/2002 | Park et al. ............ 438/424 |

* cited by examiner

*Primary Examiner*—Bradley K. Smith
(74) *Attorney, Agent, or Firm*—F. Chau & Associates LLC

(57) ABSTRACT

Methods of forming trench isolations are provided. A method includes providing a semiconductor substrate having a cell array region and a peripheral region. At least one cell trench in the cell array region and at least one peripheral trench wider than the cell trench in the peripheral region of the substrate are formed. The cell and the peripheral trenches have sidewalls. A first dielectric layer that partially fills the cell and peripheral trenches is formed over the substrate. At least one photoresist pattern that exposes at least the cell trench partially filled with the first dielectric layer is formed over the substrate. The first dielectric layer formed on the sidewalls of the exposed cell trench is etched by using the photoresist pattern as a etch mask. Subsequently, the photoresist pattern is removed. A second dielectric layer filling the cell and peripheral trenches is formed over the substrate where the photoresist pattern is removed.

21 Claims, 6 Drawing Sheets

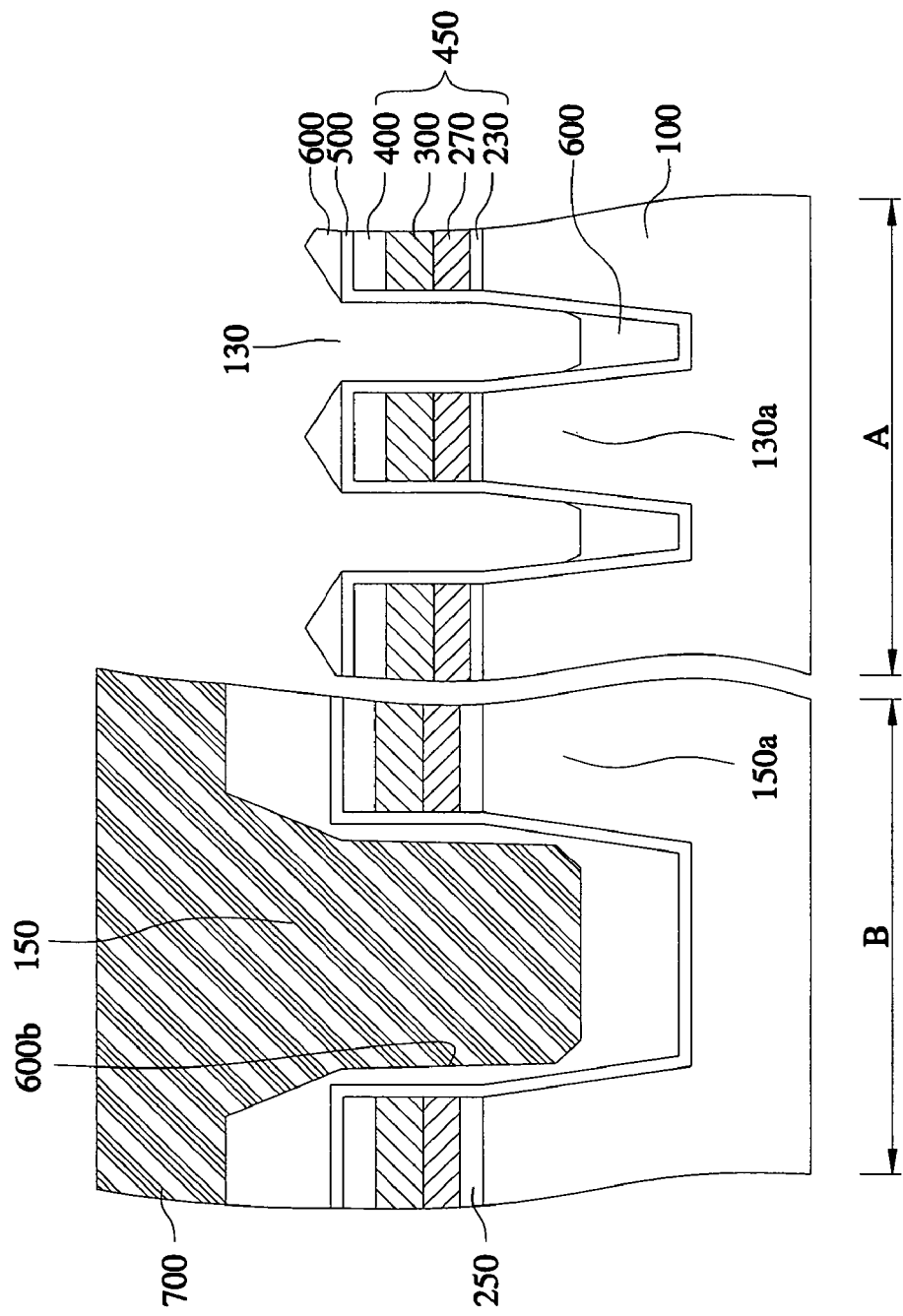

METHOD OF FORMING TRENCH ISOLATIONS

BACKGROUND OF THE INVENTION

1. Technical Field

The present invention relates generally to a method for manufacturing a semiconductor device and, more particularly, to methods for forming trench isolations.

2. Discussion of the Related Art

As semiconductor devices become more highly integrated, the size of a unit cell is reduced, thereby reducing an area occupied by an isolation region in the unit cell. Accordingly, for the isolation region, a trench isolation having a reduced width and not having a bird's beak phenomenon is used. As the width of the trench isolation decreases, an aspect ratio of a trench increases, thereby making it difficult to fill the trench with a dielectric material without a void.

FIGS. 1A and 1B are cross-sectional views illustrating a conventional method of forming a trench isolation.

With reference to FIG. 1A, a polish stop layer pattern 30 is formed over a substrate 10, and the substrate 10 is etched by using the polish stop layer pattern 30 as a mask. Here, trenches with different widths, i.e. a narrow width trench 13 and a wide width trench 15, are formed in the substrate 10. A gate dielectric layer 20 is formed between the polish stop layer pattern 30 and the substrate 10.

Next, the trenches 13, 15 are filled with a high-density plasma (hereinafter, referred to as "HDP") CVD oxide layer 40. Generally, the HDP-CVD oxide layer has improved gap-filling properties over a conventional PECVD (Plasma Enhanced Chemical Vapor Deposition) oxide layer because of the repetitive deposition and sputter etching steps used in the formation of the HDP CVD oxide layer. However, during the sputter etching process, the oxide layer sputtered from sidewalls of the trenches 13, 15 is re-deposited on an opposite sidewall. For instance, with respect to the wide width trench 15, the oxide layer is re-deposited on the entire opposite sidewall. While for the narrow width trench 13, the oxide layer is re-deposited on an upper portion of the opposite sidewall. Therefore, an oxide layer 40a formed on the upper portion of sidewalls of the narrow width trench 13 is thicker than an oxide layer 40b formed on the upper portion of the sidewalls of the wide width trench 15. Moreover, when the thick oxide layers 40a formed on the upper portion of the sidewalls of the narrow width trench 13 meet each other, the inside of the trench cannot be completely filled with the oxide layer, and a void V is formed within the narrow width trench 13.

With reference to FIG. 1B, to completely fill the narrow width trench 13 without a void, an entrance of the narrow width trench 13 is widen by wet etching the oxide layer (40a in FIG. 1A) formed on the upper portion of the sidewalls of the narrow width trench 13. Since the wet etching is performed over the entire substrate, the oxide layer (40b in FIG. 1A) formed of an upper portion of the sidewalls of the wide width trench 15 and the gate dielectric layer 20 adjacent to the wide width trench 15 are also etched, thereby forming an undercut 25. Subsequently, an oxide layer 50 is deposited to completely fill the trenches 13, 15. However, the oxide layer 50 is not deposited within the undercut 25, thereby forming a void. The void 25 and the undercut gate dielectric layer impede reliability of a semiconductor device.

U.S. Pat. No. 6,531,377 discloses a method for manufacturing an isolation comprising the steps of forming a first dielectric layer on a substrate and sidewalls of a trench, performing an isotropic etch to remove the dielectric layer on the trench sidewalls, followed by forming a second dielectric layer. However, performing the isotropic etch over the entire substrate can cause the above-mentioned problems.

Therefore, a need exists for methods of forming trench isolations that prevent an undercut from forming in a gate dielectric layer adjacent to a trench isolation and voids from forming in the trench isolation.

SUMMARY OF THE INVENTION

Provided are methods for forming trench isolations. It is an aspect of the present invention to provide methods of forming a trench isolation to obtain a void-free cell trench isolation. Another aspect of the present invention provides methods of forming trench isolation to obtain undercut-free gate dielectric layer adjacent to peripheral trench isolation.

According to an exemplary embodiment of the present invention, a method includes providing a semiconductor substrate having a cell array region and a peripheral region. At least one cell trench in the cell array region and at least one peripheral trench wider than the cell trench in the peripheral region of the substrate are formed. The cell and the peripheral trenches have sidewalls. A first dielectric layer that partially fills the cell and peripheral trenches is formed over the substrate. At least one photoresist pattern that exposes at least the cell trench partially filled with the first dielectric layer is formed over the substrate. The first dielectric layer formed on the sidewalls of the exposed cell trench is etched by using the photoresist pattern as a etch mask. Subsequently, the photoresist pattern is removed. A second dielectric layer filling the cell and peripheral trenches is formed over the substrate where the photoresist pattern is removed.

Preferably, the first dielectric layer is a HDP-CVD oxide, and the second dielectric layer is a HDP-CVD oxide or an USG oxide.

Etching the first dielectric layer formed on the sidewalls of the cell trench can be performed using a wet etching process.

Before forming the cell and peripheral trenches, it is preferable to form a gate dielectric layer over the substrate. A polish stop layer is formed over the gate dielectric layer. Subsequently, the polish stop layer and the gate dielectric layer are patterned in turn to form hard mask patterns. In this case, forming the cell and peripheral trenches is performed using the hard mask patterns as a mask.

The gate dielectric layer can be formed having a different thickness over the cell array region than the peripheral region. Preferably, the thickness of the gate dielectric layer formed over the peripheral region is greater than the thickness of the gate dielectric layer formed over the cell array region.

Before forming the hard mask patterns, it is preferable to form an oxide layer over the polish stop layer. In this case, the hard mask patterns are formed by patterning the oxide layer, the polish stop layer, and the gate dielectric layer one after another.

Before forming the first dielectric layer, it is preferable to form a first capping layer covering at least the sidewalls of the cell and peripheral trenches. Preferably, the first capping layer is a medium temperature oxide (MTO) or a high temperature oxide (HTO).

Before forming the second dielectric layer, a second capping layer is formed over the substrate where the photoresist pattern is removed. Preferably, the second capping layer is a MTO or a HTO.

According to another exemplary embodiment of the present invention, a method comprises providing a semiconductor substrate having a cell array region and a peripheral region. A gate dielectric layer, a polysilicon layer, a polish stop layer are formed over the substrate, one after another. Hard mask patterns are formed by patterning the polish stop layer, the polysilicon layer, and the gate dielectric layer one after another to expose the substrate, wherein the exposed substrate of the peripheral region is wider than the exposed substrate of the cell array region. The exposed substrate is etched to form at least one cell trench in the cell array region and at least one peripheral trench wider than the cell trench in the peripheral region, wherein the cell and the peripheral trenches have sidewalls. Subsequently, a first dielectric layer that partially fills the cell and peripheral trenches is formed over the substrate. At least one photoresist pattern that exposes at least the cell trench partially filled with the first dielectric layer is formed over the substrate. The first dielectric layer formed on the sidewalls of the exposed cell trench is etched using the photoresist pattern as a etch mask. Subsequently, the photoresist pattern is removed. A second dielectric layer filling the cell and peripheral trenches is formed over the substrate where the photoresist pattern is removed.

Preferably, the first dielectric layer is a HDP-CVD oxide, and the second dielectric layer is a HDP-CVD oxide or an USG oxide.

In addition, Etching the first dielectric layer formed on the sidewalls of the cell trench can be performed using a wet etching process.

In forming the gate dielectric layer, it is preferable to form the gate dielectric layer over the peripheral region thicker than the gate dielectric layer over the cell array region.

Before forming the hard mask patterns, it is preferable to form an oxide layer on the polish stop layer. In this case, the hard mask patterns are formed by patterning the oxide layer, the polish stop layer, the polysilicon layer, and the gate dielectric layer one after another.

Before forming the first dielectric layer, it is preferable to form a first capping layer covering at least the sidewalls of the cell and peripheral trenches. Preferably, the first capping layer is a MTO or a HTO.

Before forming the second dielectric layer, it is preferable to form a second capping layer over the substrate where the photoresist pattern is removed. Preferably, the second capping layer is a MTO or a HTO.

These and other exemplary embodiments, features, aspects, and advantages of the present invention will be described and become apparent from the following detailed description of the exemplary embodiments when read in conjunction with accompanying drawings.

BRIEF DESCRIPTION OF THE DRAWINGS

FIGS. 2A to 2E are cross-sectional views illustrating a method of forming trench isolations according to an exemplary embodiment of the present invention.

DETAILED DESCRIPTION OF EXEMPLARY EMBODIMENTS

Figure 1A:
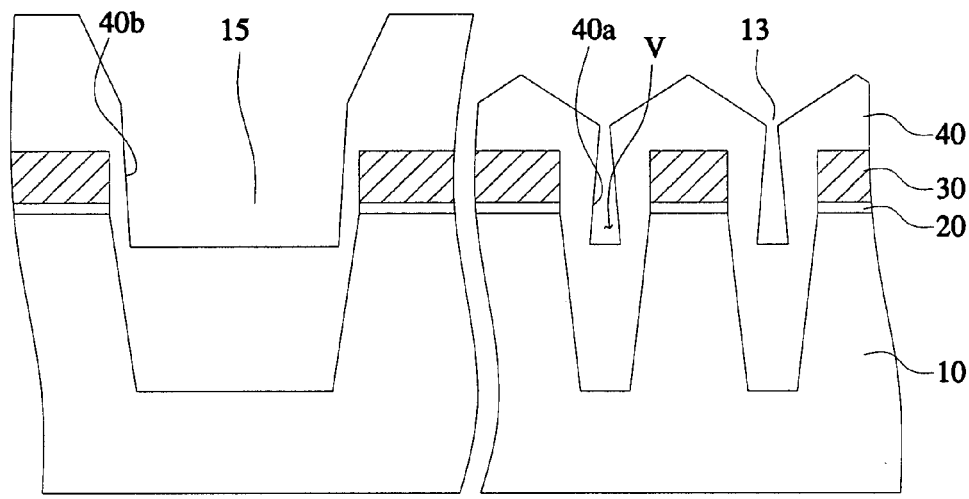
FIGS. 1A and 1B are cross-sectional views illustrating a conventional method of forming trench isolations.
Figure 1B:
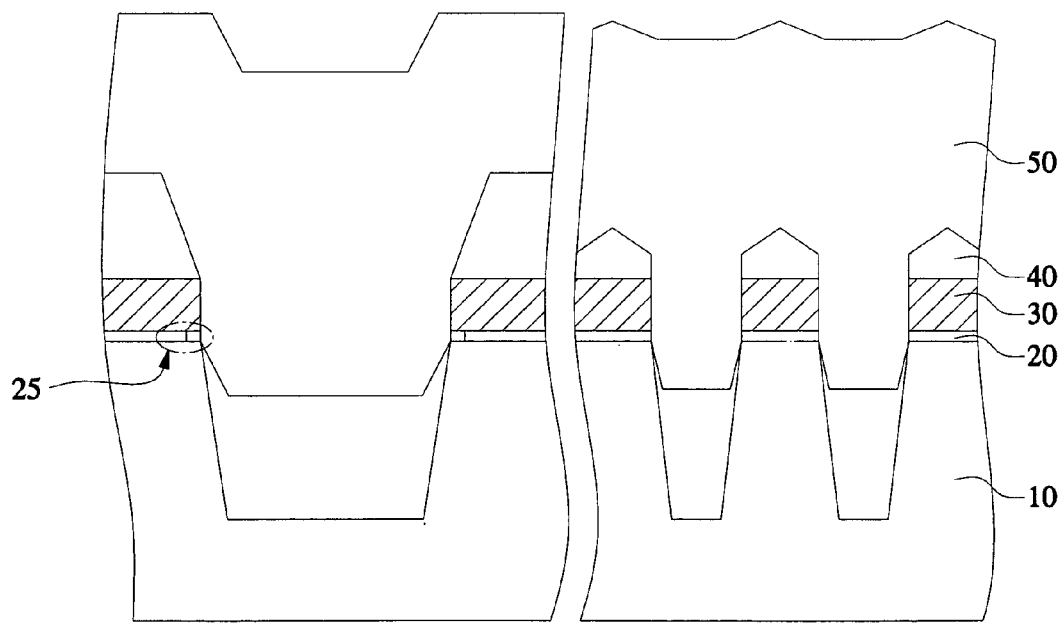

Exemplary embodiments of the present invention will be described in detail below with reference to the accompanying drawings. However, the present invention is not restricted by exemplary embodiments described herein but can be embodied in other forms.

In the drawings, when it is stated that a layer lies "on" the other layer or a substrate, it means the layer can be formed directly on the other layer or the substrate, or another layer can be interposed between the layer and the other layer or substrate. Throughout the specification, the same reference numerals represent the same components.

FIGS. 2A to 2E are cross-sectional views illustrating a method of forming trench isolations according to an exemplary embodiment of the present invention.

In the above drawings, a region indicated by reference numeral 'A' represents a cell array region, while a region indicated by reference numeral 'B' represents a peripheral region where high voltage is applied.

Figure 2A:
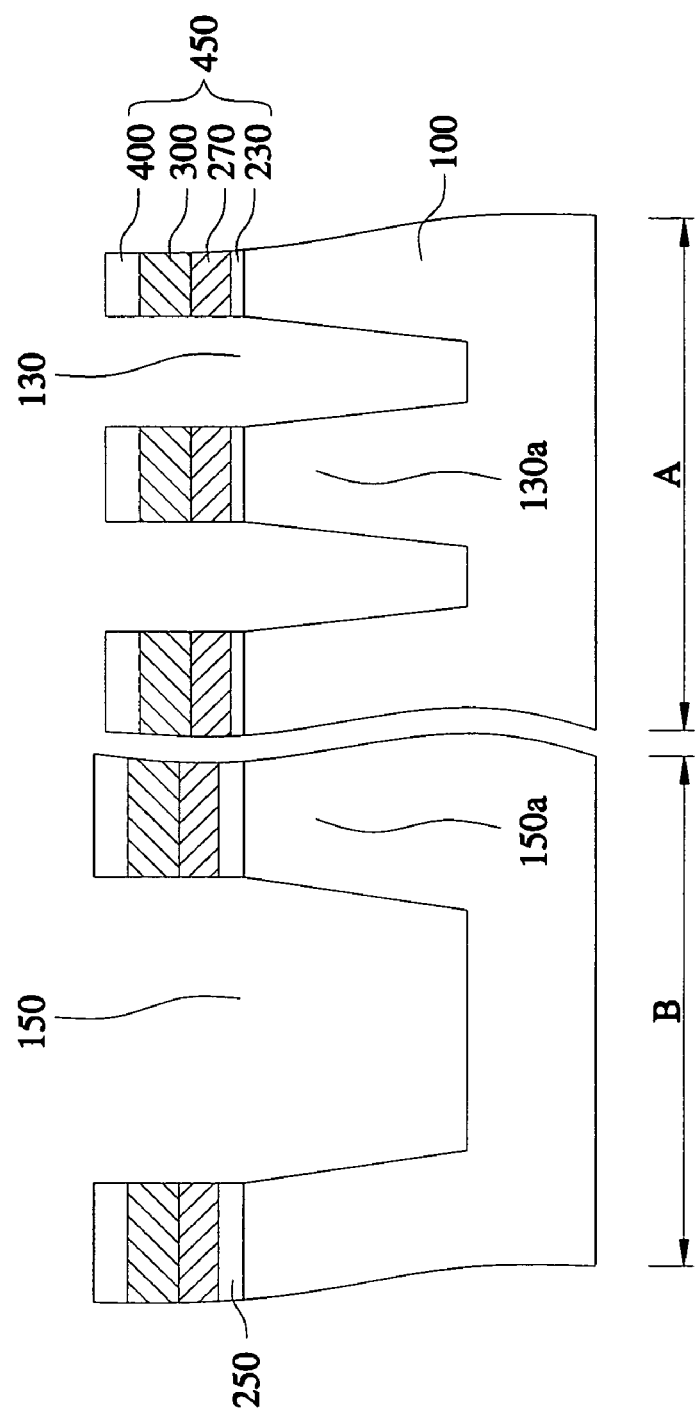

Referring to FIG. 2A, a semiconductor substrate having a cell array region A and a peripheral region B is provided. The cell array region A of the substrate is where a cell array will be formed, and the peripheral region B of the substrate is where a peripheral circuit will be formed. Subsequently, a cell gate dielectric layer 230 and a peripheral gate dielectric layer 250 are formed on the cell array region A and peripheral region B, respectively.

The gate dielectric layers 230, 250 can be formed having a different thickness on the cell array region A and peripheral region B, respectively. For a non-volatile memory device, MOS transistors operated by low voltage in a read mode, i.e. low voltage MOS transistors, will be formed in the cell array region A, and MOS transistors operated by high voltage in a program mode or an erase mode, i.e. high voltage MOS transistors, will be formed in the peripheral region B. Accordingly, it is preferable that the gate dielectric layer of the high voltage MOS transistor, i.e. the peripheral gate dielectric layer 250 of the peripheral region B, is formed having a greater thickness than that of the low voltage MOS transistor, i.e. the cell gate dielectric layer 230 of the cell array region A.

Further, a method for forming the cell gate dielectric layer 230 on the cell array region A and the peripheral gate dielectric layer 250 on the peripheral region B having a greater thickness than the cell gate dielectric layer 230 in the cell array region A may include a first gate dielectric layer having a thickness of about 300 Å formed on the entire substrate 100 by thermal oxidation. Subsequently, a first photoresist pattern (not shown) covering the first gate dielectric layer of the peripheral region B is formed. Thus, the first gate dielectric layer of the cell array region A is exposed. Next, the exposed first gate dielectric layer of the cell array region A is wet etched to expose the substrate 100 of the cell array region A. The first photoresist pattern is then removed. In addition, by thermal oxidizing the substrate 100 where the first photoresist pattern is removed, a second gate dielectric layer having a thickness of about 30 Å is formed. As a result, the peripheral gate dielectric layer 250 having a thickness of about 300 Å is formed on the peripheral region B, and the cell gate dielectric layer 230 having a thickness of about 30 Å is formed on the cell array region A, Subsequently, a polish stop layer 300 and an oxide layer 400 are stacked on the gate dielectric layers 230, 250 one after another. Preferably, the polish stop layer 300 is silicon nitride, and the polish stop layer 300 is formed having a thickness in the range of about 300 to about 1000 Å. Before forming the polish stop layer 300, a polysilicon layer 270 that will form an underlying floating gate can be formed on the gate dielectric layers 230, 250, for a self-aligned non-volatile memory device. Preferably, the oxide layer 400 is formed having a thickness of about 300 Å.

Next, the oxide layer 400, the polish stop layer 300, the polysilicon layer 270, and the gate dielectric layers 230, 250 are etched one after another by using a second photoresist pattern (not shown) as a mask, thereby forming a hard mask pattern 450, and at the same time, exposing the substrate 100. At this time, a uniform hard mask pattern 450 can be formed due to the oxide layer 400. In addition, the exposed substrate 100 of the peripheral region B is wider than that of the cell array region A.

Subsequently, after removing the second photoresist pattern, the exposed substrate 100 is etched by using the hard mask pattern 450 as a mask to form at least one cell trench 130 and at least one peripheral trench 150. Each of the cell and peripheral trenches 130, 150 has sidewalls and a bottom. The cell trench 130 is formed in the cell array region A to define a cell active region 130a, and the peripheral trench 150 is formed in the peripheral region B to define a peripheral active region 150a. The peripheral trench 150 is wider than the cell trench 130, which improves the reliability of the isolation at the peripheral region B where high voltage is applied.

Figure 2B:
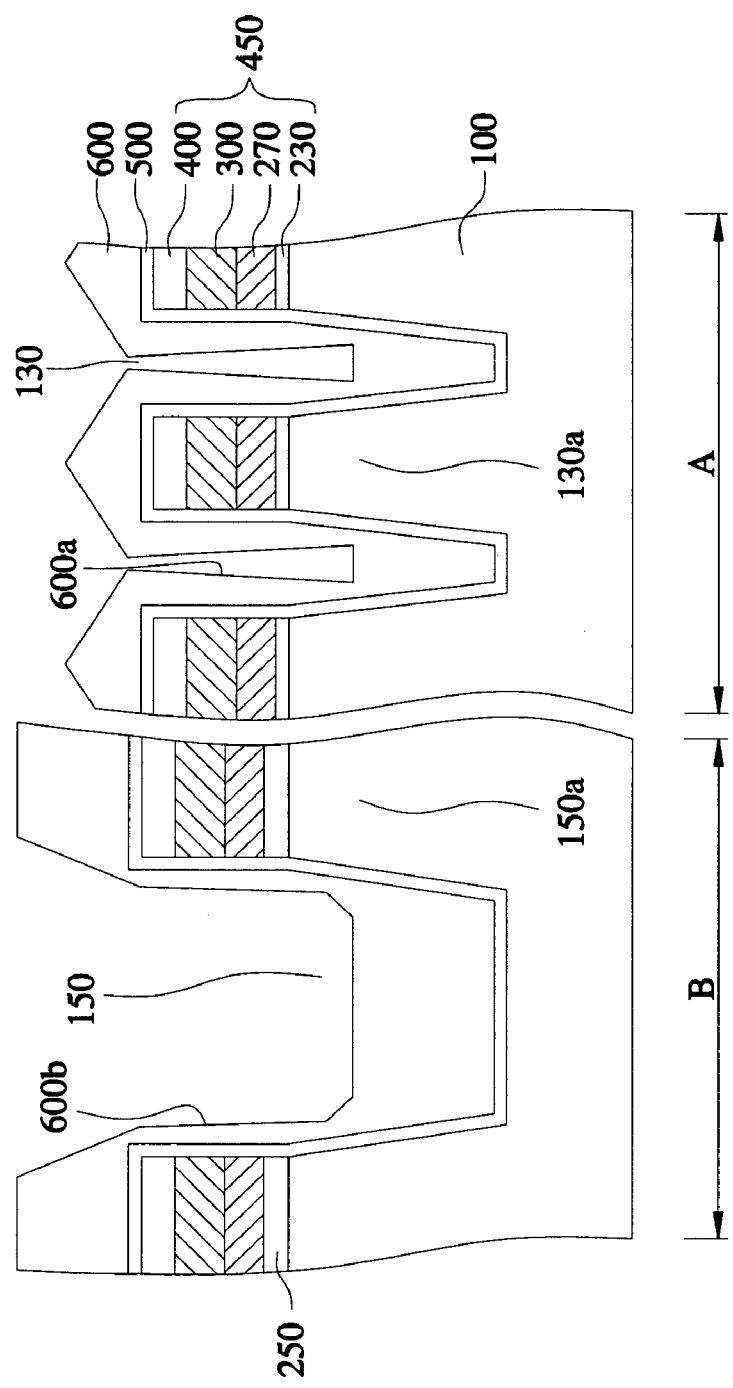

Referring to FIG. 2B, it is preferable to form a thermal oxide layer (not shown) on the sidewalls and bottom of the trenches 130, 150. By forming the thermal oxide layer, damage done to the substrate 100 in forming the trenches 130, 150 can be cured.

Preferably, a first capping layer 500 is formed on the semiconductor substrate 100 where the thermal oxide layer is formed. After forming the first capping layer 500, a first dielectric layer 600 is formed that partially fills the trenches 130, 150. Preferably, the first dielectric layer 600 fills about ⅔ of the depth of the trenches 130, 150.

Preferably, the first dielectric layer 600 is a HDP-CVD oxide, which has improved gap-filling properties. The HDP-CVD oxide has improved gap-filling properties due to a repetitive process of deposition and sputter etching during formation. However, the oxide, which is sputtered from the sidewalls of the trenches 130, 150 during the sputter etching process, reaches the opposite sidewalls and re-deposits on the opposite sidewalls. With respect to the peripheral trench 150 having a wide width, the oxide is re-deposited on the entire surface of the sidewalls. With respect to the cell trench 130 having a narrow width, the oxide is re-deposited mostly on an upper portion of the sidewalls. Therefore, an oxide 600a formed on the upper sidewalls of the cell trench 130 is thicker than an oxide 600b formed on an upper portion of the sidewalls of the peripheral trench 150. Accordingly, the aspect ratio of the cell trench 130 increases because a vacancy is formed within the cell trench 130 and is not being filled with the first dielectric layer 600.

The first capping layer 500 protects the polish stop layer 300 on the active regions 130a, 150a. In other words, when the first dielectric layer 600 is formed of a HDP-CVD oxide, the first capping layer 500 prevents the upper corner of the polish stop layer 300 from being etched by a sputter etching process. The first capping layer 500 can be formed of a medium temperature oxide (MTO) or a high temperature oxide (HTO).

Referring to FIG. 2C, a third photoresist pattern 700 exposing at least the cell trench is formed on the substrate 100 where the first dielectric layer 600 is formed. Preferably, the third photoresist pattern 700 exposes all of the cell array region A. Subsequently, the first dielectric layer (600a of FIG. 2B) formed on the upper portion of the sidewalls of the cell trench 130 in the exposed cell array region A is etched to expose the underlying first capping layer 500. At this time, the first dielectric layer 600 formed over the hard mask pattern 450 and on the bottom of the cell trench 130 is also etched. When the first capping layer 500 is not formed, in etching the first dielectric layer (600a of FIG. 2B), the first dielectric layer (600a) is partially left on the upper sidewall of the cell trench 130 to prevent exposure of the gate dielectric layer 230 adjacent to the cell trench 130.

Consequently, as the first dielectric layer (600a of FIG. 2B) is entirely etched or partially etched, an entrance of the cell trench 130 is made wider, thereby decreasing the aspect ratio of cell trench 130. On the other hand, the first dielectric layer 600b formed on the upper portion of the sidewalls of the peripheral trench 150 is protected by the photoresist pattern 700. The photoresist pattern 700 thus prevents the first dielectric layer 600b from being etched. Therefore, the gate dielectric layer 250 adjacent to the peripheral trench 150 is prevented from being undercut, thereby preventing the formation of a void within the trench in a subsequent process.

The first dielectric layer (600a of FIG. 2B) can be etched using a wet etching process. Preferably, the solution used in the wet etching process is a buffered oxide etchant (BOE) solution, which is a mixture of ammonium fluoride ($NH_4F$) and hydrofluoric acid (HF).

Figure 2D:
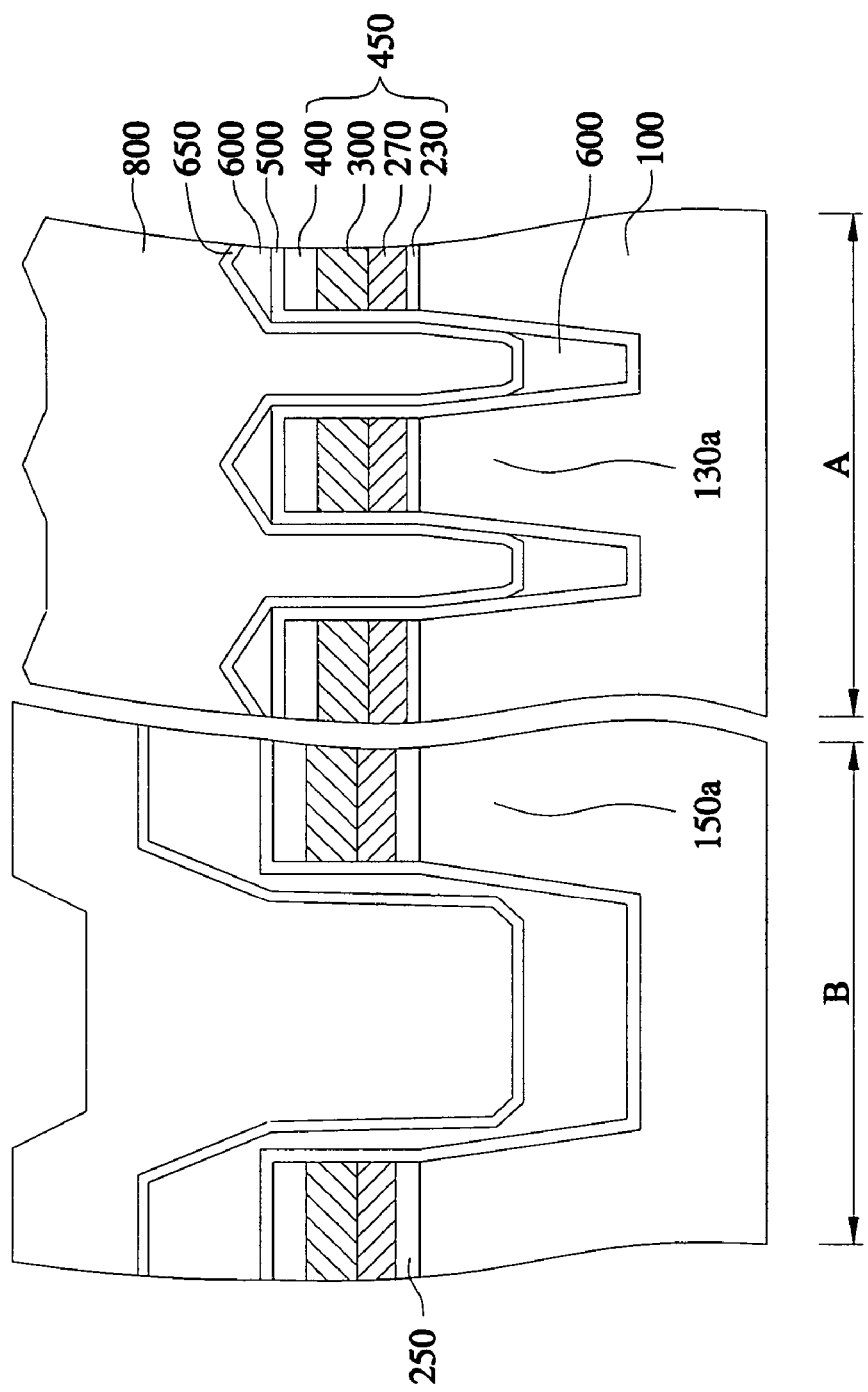

Referring to FIG. 2D, after removing the third photoresist pattern (700 of FIG. 2C), a second dielectric layer 800 is formed filling the cell trench 130 and peripheral trench 150 on the substrate 100 where the photoresist pattern (700 of FIG. 2C) is removed. By decreasing the aspect ratio of cell trench 130, a second dielectric layer 800 can be formed without a void. Therefore, the trenches 130, 150 are completely filled with the second dielectric layer 800. Preferably, the second dielectric layer 800 is a HDP-CVD oxide or an USG oxide.

Before forming the second dielectric layer 800, it is preferable to form a second capping layer 650 on the substrate 100 where the third photoresist pattern (700 of FIG. 2C) is removed. When the second dielectric layer 800 is formed of a HDP-CVD oxide, the second capping layer 650 prevents the upper corner of the polish stop layer 300 adjacent to the trenches 130, 150 from being etched by a sputter etching process during the formation process of the HDP-CVD oxide, e.g., the first capping layer 500. The second capping layer 650 may be formed of a MTO (medium temperature oxide) or a HTO (high temperature oxide).

Figure 2E:
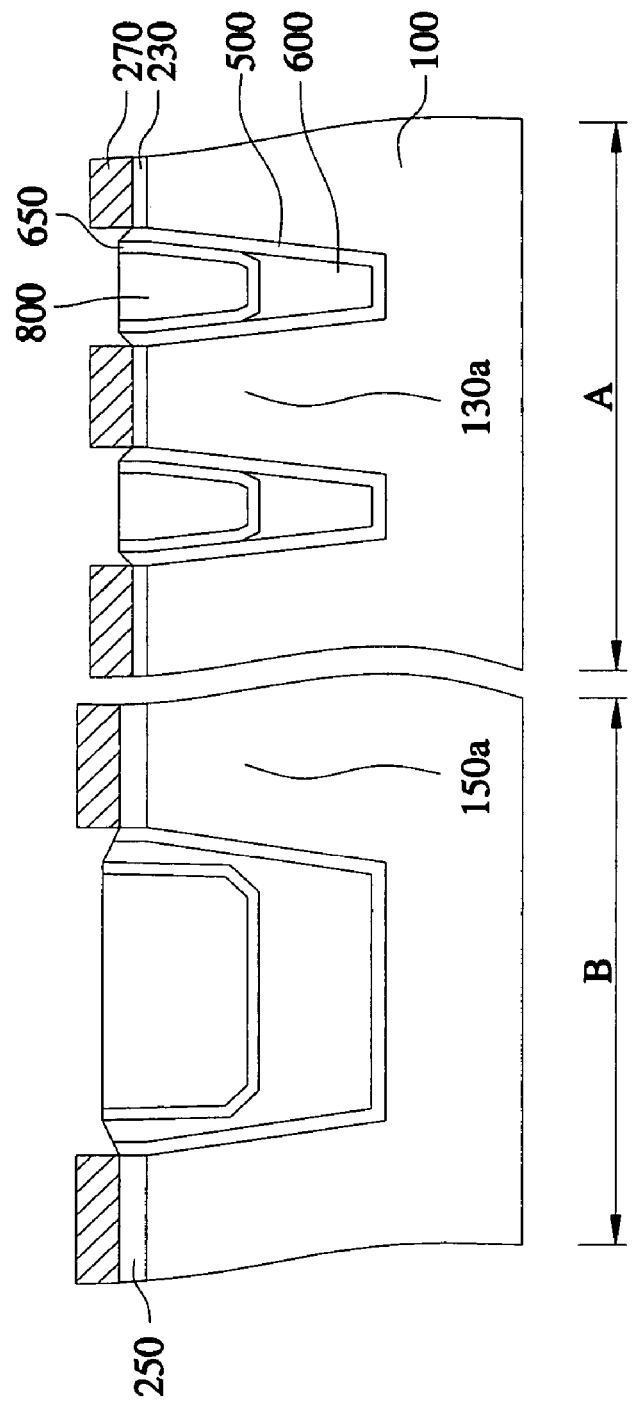

Referring to FIG. 2E, the polish stop layer 300 is exposed by polishing the substrate 100 with a chemical mechanical polishing (hereinafter, referred to as "CMP") where the second dielectric layer 800 is formed. Next, the exposed polish stop layer 300 is removed to expose the polysilicon layer 270, thereby completing formation of trench isolations.

According to the exemplary embodiments of the present invention, methods of forming a trench isolation are provided that form a cell trench isolation without a void and prevent an undercut from forming in a gate dielectric layer adjacent to a peripheral trench.

What is claimed is:

1. A method of forming trench isolations comprising the steps of:

providing a semiconductor substrate having a cell array region and a peripheral region;

forming at least one cell trench in the cell array region and at least one peripheral trench wider than the cell trench in the peripheral region of the substrate, wherein the cell and the peripheral trenches have sidewalls;

forming a first dielectric layer that partially fills the cell trench and the peripheral trench over the substrate;

forming at least one photoresist pattern that exposes at least the cell trench partially filled with the first dielectric layer over the substrate;
etching the first dielectric layer formed on the sidewalls of the exposed cell trench using the photoresist pattern as a etch mask;
removing the photoresist pattern;
forming a second capping layer over the substrate where the photoresist pattern is removed before forming a second dielectric layer; and
forming the second dielectric layer filling the cell trench and the peripheral trench over the substrate where the photoresist pattern is removed.

2. The method of forming trench isolations according to claim 1, further comprising:
forming a gate dielectric layer over the substrate;
forming a polish stop layer over the gate dielectric layer; and
forming hard mask patterns by patterning the polish stop layer and the gate dielectric layer in turn, wherein the gate dielectric, the polish stop layer, and the hard mask patterns are formed before forming the cell trench and the peripheral trench, and wherein forming the cell trench and peripheral trench is performed using the hard mask patterns as a mask.

3. The method of forming trench isolations according to claim 2, wherein the gate dielectric layer is formed having a different thickness over the cell array region than over the peripheral region.

4. The method of forming trench isolations according to claim 3, wherein the thickness of the gate dielectric layer formed over the peripheral region is greater than the thickness of the gate dielectric layer formed over the cell array region.

5. The method of forming trench isolations according to claim 2, further comprising:
forming an oxide layer over the polish stop layer before forming the hard mask patterns, wherein forming the hard mask patterns is done by patterning the oxide layer, the polish stop layer, and the gate dielectric layer one after another.

6. The method of forming trench isolations according to claim 1, further comprising:
forming a first capping layer covering at least the sidewalls of the cell trench and the peripheral trench before forming the first dielectric layer.

7. The method of forming trench isolations according to claim 6, wherein the first capping layer is a MTO or a HTO.

8. The method of forming trench isolations according to claim 1, wherein the first dielectric layer is a HDP-CVD oxide.

9. The method of forming trench isolations according to claim 1, wherein etching the first dielectric layer formed on the sidewalls of the cell trench is performed using a wet etching process.

10. The method of forming trench isolations according to claim 1, wherein the second capping layer is a MTO or a HTO.

11. The method of forming trench isolations according to claim 1, wherein the second dielectric layer is a HDP-CVD oxide or an USG oxide.

12. A method of forming trench isolations for a non-volatile memory device, comprising the steps of:
providing a semiconductor substrate having a cell array region and a peripheral region;
forming a gate dielectric layer, a polysilicon layer, a polish stop layer one after another over the substrate;
forming hard mask patterns by patterning the polish stop layer, the polysilicon layer, and the gate dielectric layer one after another to expose the substrate, wherein the exposed substrate of the peripheral region is wider than the exposed substrate of the cell array region;
forming at least one cell trench in the cell array region and at least one peripheral trench wider than the cell trench in the peripheral region by etching the exposed substrate, wherein the cell trench and the peripheral trench have sidewalls;
forming a first dielectric layer that partially fills the cell trench and the peripheral trench over the substrate;
forming at least one photoresist pattern that exposes at least the cell trench partially filled with the first dielectric layer over the substrate;
etching the first dielectric layer formed on the sidewalls of the exposed cell trench using the photoresist pattern as a etch mask;
removing the photoresist pattern; and
forming a second dielectric layer filling the cell trench and the peripheral trench over the substrate where the photoresist pattern is removed.

13. The method of forming trench isolations for a non-volatile memory device according to claim 12, wherein the gate dielectric layer over the peripheral region is thicker than the gate dielectric layer over the cell array region.

14. The method of forming trench isolations for a non-volatile memory device according to claim 12, further comprises forming an oxide layer on the polish stop layer before forming the hard mask patterns, wherein the hard mask patterns are formed by patterning the oxide layer, the polish stop layer, the polysilicon layer, and the gate dielectric layer one after another.

15. The method of forming trench isolations for a non-volatile memory device according to claim 12, further comprises forming a first capping layer covering at least the sidewalls of the cell trench and the peripheral trench before forming the first dielectric layer.

16. The method of forming trench isolations for a non-volatile memory device according to claim 15, wherein the first capping layer is a MTO or a HTO.

17. The method of forming trench isolations for a non-volatile memory device according to claim 12, wherein the first dielectric layer is a HDP-CVD oxide.

18. The method of forming trench isolations for a non-volatile memory device according to claim 12, wherein etching the first dielectric layer formed on the sidewalls of the cell trench is performed using a wet etching process.

19. The method of forming trench isolations for a non-volatile memory device according to claim 12, further comprises forming a second capping layer over the substrate where the photoresist pattern is removed before forming the second dielectric layer.

20. The method of forming trench isolations for a non-volatile memory device according to claim 19, wherein the second capping layer is a MTO or a HTO.

21. The method of forming trench isolations for a non-volatile memory device according to claim 12, wherein the second dielectric layer is a HDP-CVD oxide or an USG oxide.

* * * * *